(12) United States Patent
Shimoji (10) Patent No.: US 7,928,649 B2
(45) Date of Patent: Apr. 19, 2011

(54) ORGANIC LUMINESCENT DEVICE

(75) Inventor: Noriyuki Shimoji, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 8 days.

(21) Appl. No.: 12/317,262

(22) Filed: Dec. 19, 2008

(65) Prior Publication Data

US 2009/0174319 A1    Jul. 9, 2009

(30) Foreign Application Priority Data

Dec. 21, 2007   (JP) ................................ 2007-330943

(51) Int. Cl.
*H01J 1/62*   (2006.01)
(52) U.S. Cl. ........................................ 313/504; 313/506
(58) Field of Classification Search ............... 313/504, 313/506, 509, 512
See application file for complete search history.

(56) References Cited

U.S. PATENT DOCUMENTS

2005/0026530 A1* 2/2005 Toguchi et al. ................ 445/24
2006/0012291 A1* 1/2006 Chang et al. ................ 313/504

FOREIGN PATENT DOCUMENTS

JP    2006-269328    10/2006

* cited by examiner

*Primary Examiner* — Vip Patel
(74) *Attorney, Agent, or Firm* — Hamre, Schumann, Mueller & Larson, P.C.

(57) ABSTRACT

An organic luminescent device according to the present invention includes a substrate, an organic luminescent layer, and a reflection electrode. Here, the substrate has first and second principal surfaces opposed to each other; the organic luminescent layer is arranged on the first principal surface of the substrate, and is held between a pair of electrodes at least one of which is a transparent electrode; and the reflection electrode is adjacent to a luminescent area of the organic luminescent layer and is arranged on a front surface or a back surface of the transparent electrode. The transparent electrode is arranged on the first principal surface of the substrate, while the reflection electrode is arranged on the transparent electrode. The second principal surface of the substrate is formed into a rough surface at least on its part opposed to the reflection electrode. This configuration improves light extraction efficiency.

4 Claims, 6 Drawing Sheets

--PRIOR ART--

ORGANIC LUMINESCENT DEVICE

CROSS REFERENCE TO RELATED APPLICATIONS AND INCORPORATION BY REFERENCE

This application is based upon and claims the benefit of prior Japanese Patent Application P2007-330943 filed on December, 21; the entire content of which is incorporated by reference herein.

BACKGROUND OF THE INVENTION

1. Field of the Invention

The present invention relates to an organic luminescent device, and particularly to an organic luminescent device with improved light extraction efficiency.

2. Description of the Related Art

In recent years, an organic electroluminescence (EL) device known as an organic luminescent device has been developed for practical use from a viewpoint of its application to display and illumination. An organic EL device is a device configured so that a thin-film luminescent layer made of an organic compound is held between electrodes on a substrate made of a glass or the like, and configured to emit light by supplying an electric current between the electrodes.

When an organic EL device is used as a light source for illumination or the like, it is necessary to extract emitted light to the outside as much as possible. However, in a conventional organic luminescent device, approximately 80% of emitted light is absorbed by the glass substrate and the luminescent layer, and only the remaining approximately 20% of the light can be extracted to the outside.

Figure 9:
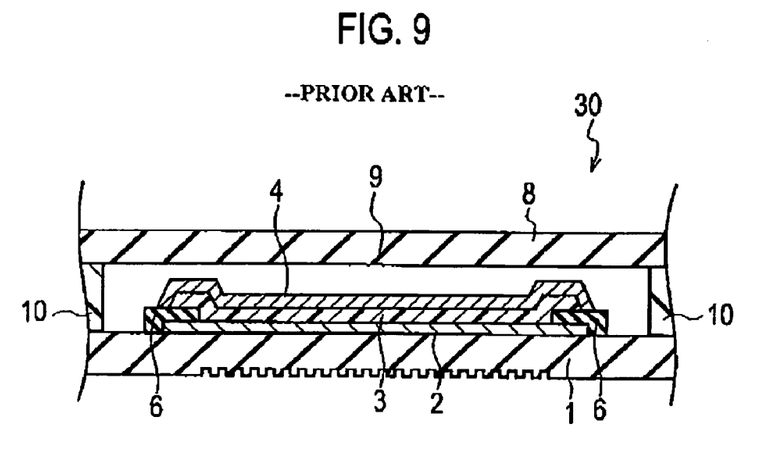
FIG. 9 is a schematic cross-sectional structural view of the conventional organic luminescent device.

FIG. 9 shows an example of a structure of a conventional organic EL device. In this organic EL device 30, an anode 2, an organic luminescent layer 3 and a cathode 4 are formed in lamination on a glass substrate 1, and are sealed by a glass-made sealing plate 8 on the glass substrate 1 with a seal resin 10 adhesively interposed therebetween. Concave and convex portions are formed on an outer surface of the glass substrate 1 that is opposed to the luminescent area thereof. This structure prevents the emitted light from being totally reflected, trapped and absorbed in the glass substrate 1, so that light extraction efficiency is improved.

Furthermore, there has been disclosed an organic EL device in which a lens layer is provided between the luminescent layer and the substrate while concave and convex portions are provided on an interface between the substrate and the lens layer (see Japanese Patent Application Publication No. 2006-269328, for instance). With this structure, the concave and convex portions formed on the interface prevent total reflection on the interface between the lens layer and the substrate, so that light extraction efficiency is improved.

However, there has been a problem that, generally, light radiating from the luminescent area is repeatedly propagated and reflected to be absorbed by the glass substrate and the seal resin, thereby turning into heat.

In addition, when multiple organic EL light sources are used as a back light source, connection areas thereof emit no light. As a result, uneven light is emitted from the light source. On the other hand, if a diffusion plate or the like is used to cover the connection areas, the light source itself is inevitably made thicker. In this case, another problem arises that the characteristic thin shape of the organic EL device cannot be utilized fully.

SUMMARY OF THE INVENTION

The present invention is devised to solve the above-described problems. An object of the present invention is to provide an organic luminescent device with improved light extraction efficiency.

According to an aspect of the present invention devised to achieve the above object, provided is an organic luminescent device 20 characterized by including: a substrate 1 having first and second principal surfaces which are opposed to each other; an organic luminescent layer 3 arranged on the first principal surface of the substrate 1, the organic luminescent 3 being held between a pair of electrodes (2, 4), and at least one of the pair of electrodes (2, 4) being a transparent electrode; a reflection electrode 5 contiguous to a luminescent area of the organic luminescent layer 3, the reflection electrode 5 being arranged on a front surface or a back surface of the transparent electrode 2. The organic luminescent device 20 is also characterized in that: the transparent electrode 2 is arranged on the first principal surface of the substrate 1; the reflection electrode 5 is arranged on the transparent electrode 2; and the second principal surface of the substrate 1 is formed into a rough surface at least on its part opposed to the reflection electrode 5.

According to the present invention, it is possible to provide an organic luminescent device with improved light extraction efficiency.

BRIEF DESCRIPTION OF THE DRAWINGS

FIGS. 2A to 2F are explanatory views showing a method of manufacturing the organic luminescent device according to the first embodiment of the present invention.

FIGS. 8A to 8B are explanatory views each showing how light progressing out of a luminescent area of an organic luminescent device travels.

DETAILED DESCRIPTION OF THE INVENTION

Hereinbelow, descriptions are provided for organic luminescent devices according to the embodiments of the present invention by referring to the drawings. In the following drawings, the same or similar components are denoted by the same or similar reference numerals. Note that the drawings represent components schematically and the components are different from real ones. Furthermore, note that the drawings include some components whose mutual dimensional relationships and ratios are different from one drawing to another.

First Embodiment (Structure of Organic Luminescent Device)

Figure 1:
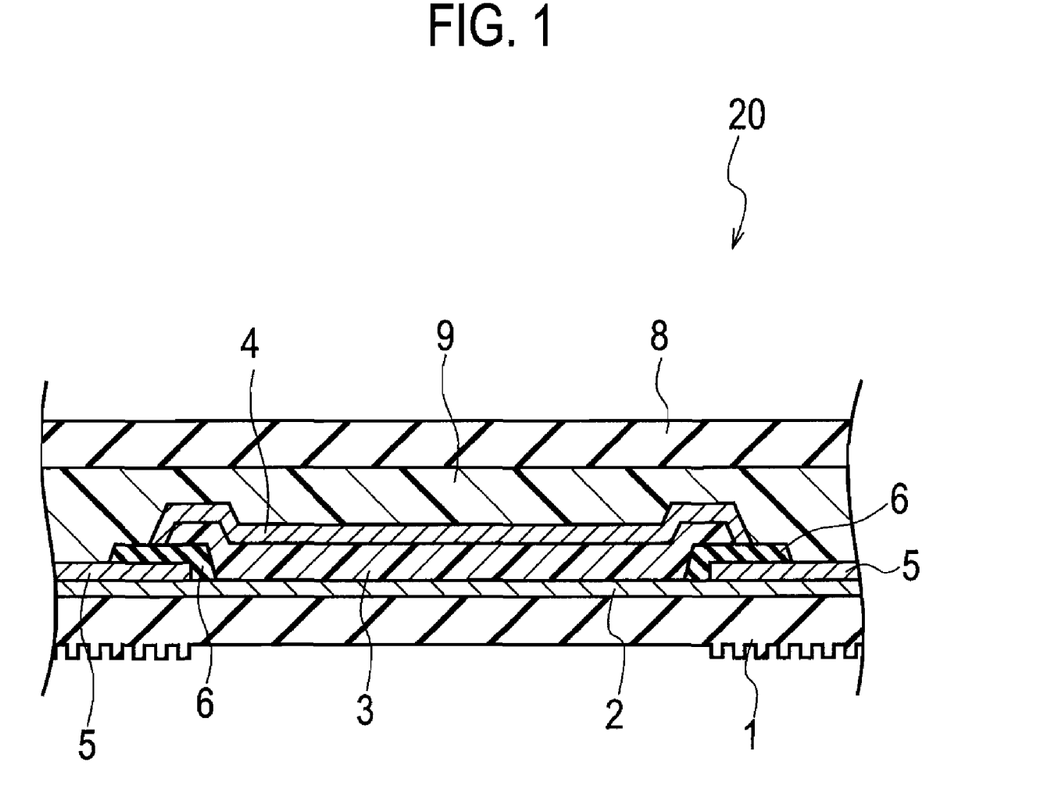
FIG. 1 is a schematic cross-sectional structural view of an organic luminescent device according to a first embodiment of the present invention.

As shown in FIG. 1, an organic luminescent device according to a first embodiment of the present invention includes: a substrate 1 having first and second principal surfaces opposed to each other; an organic luminescent layer 3 arranged on the first principal surface of the substrate 1, the organic luminescent layer 3 held between a pair of electrodes (2, 4), and at least one of the pair of electrodes (2, 4) being a transparent electrode; a reflection electrode 5 adjacent to a luminescent area of the organic luminescent layer 3, the reflection electrode 5 arranged on a front surface or a back surface of the transparent electrode 2. A transparent electrode 2 is arranged on the first principal surface of the substrate 1; the reflection electrode 5 is arranged on the transparent electrode 2; and the second principal surface of the substrate 1 is formed into a rough surface at least on its part opposed to the reflection electrode 5.

Note that the first principal surface of the substrate 1 is a surface of the substrate on which the organic luminescent layer 3 is formed, and that the second principal surface of the substrate 1 is a back surface of the substrate 1 from the first principal surface.

In the first embodiment, an organic luminescent device 20 has a so-called bottom emission structure in which light emitted from the organic luminescent layer 3 is extracted from the substrate 1.

In the organic luminescent device 20, an anode 2, the organic luminescent layer 3 and a cathode 4 are sequentially stacked one on another on the first principal surface of the substrate 1. The anode 2 and the cathode 4 are insulated from each other with an insulating layer 6 interposed therebetween. An anode terminal (unillustrated) disposed by extension of the anode 2 is formed in the anode 2. A cathode terminal (unillustrated) disposed by extension of the cathode 4 is formed in the cathode 4.

The reflection electrode 5 is contiguous to an end portion of the luminescent area (an area of the organic luminescent layer 3 extending in the longitudinal direction in FIG. 1), and is arranged on the front surface of the anode 2. The reflection layer 5 and the cathode 4 are insulated from each other with the insulating layer 6 interposed therebetween.

A sealing plate 8 is arranged in intimate contact with the front surface of the cathode 4 with a filler member 9 interposed therebetween. In addition, the sealing plate 8 is joined to an outer peripheral portion of the substrate 1 with a seal resin 10 (see FIG. 8B) interposed therebetween. Thereby, the organic luminescent layer 3 is sealed with the sealing plate 8.

The filler member 9 is filled in a space between the sealing plate 8 and the substrate 1.

This organic luminescent device 20 is configured so that light is emitted through the substrate 1. For this reason, a transparent substrate, such as a glass substrate or the like, which transmits light is used as the substrate 1.

The rough surface in the second principal surface of the substrate 1 preferably has an arithmetic mean roughness Ra of 0.01 μm to 1 μm, and more preferably 0.1 μm to 1 μm.

The anode 2 is capable of transmitting light. The anode 2 is a transparent electrode made of ITO (indium-tin oxide) with a thickness of approximately 150 nm to 160 nm, for instance.

The organic luminescent layer 3 is formed by sequentially stacking a hole transport layer, a luminescent part and an electron transport layer on the substrate 1.

The hole transport layer is configured to smoothly transport holes, injected from the anode 2, to the luminescent part. The hole transport layer is made of NPB (N, N-di(naphthalene-1-yl)-N, N-diphenyl-benzidine), and has a thickness of approximately 60 nm, for instance.

The electron transport layer is configured to smoothly transport electrons, injected from the cathode 4, to the luminescent part. The electron transport layer is made of $Alq_3$ (aluminum quinolinol complex), and has a thickness of approximately 35 nm, for instance.

The luminescent part is configured to emit light by recombination of the injected holes and electrons. The luminescent part is made of $Alq_3$ doped with a coumarin compound ($C_{545}T$) by 1% concentration, and has a thickness of approximately 30 nm.

Note that the organic luminescent layer 3 may be configured by using, for instance, a hole injection layer, an electron injection layer and the like, instead of the hole transport layer and the electron transport layer.

The cathode 4 has a thickness of approximately 150 nm, and is made of aluminum, for instance.

The reflection layer 5 is preferably made of a metal with higher light-reflecting properties. Aluminum, silver, nickel and the like can be cited as examples of the metal. The reflection layer 5 is made of aluminum, and has a thickness of approximately 100 nm, for instance.

The sealing plate 8 is configured to protect and seal the anode 2, the cathode 4 and the organic luminescent layer 3. Glass, a metal such as a stainless steel (SUS) or copper, a ceramic, or the like is used for as a material for the sealing plate 8.

The filler member 9 is configured to dissipate heat by transmitting Joule heat, which is generated in the organic luminescent layer 3, to the sealing plate 8. A resin such as a UV-cured resin, an epoxy resin or the like is preferably used for the filler member 9.

A UV-cured resin, an epoxy resin or the like is used for the seal resin 10.

(Operating Theory)

The operating theory of the organic luminescent device according to the first embodiment of the present invention is as follows.

A certain voltage is applied between the anode 2 and the cathode 4 of the organic luminescent device 20 through the anode terminal (unillustrated) and the cathode terminal (unillustrated), respectively. Thereby, holes are injected into the luminescent part from the anode 2 through the hole transport layer, while electrons are injected into the luminescent part from the cathode 4 through the electron transport layer. Thus, light is emitted by recombination of the holes and electrons injected into the luminescent part. The emitted light is radiated to the outside through the substrate 1.

(Manufacturing Method)

FIGS. 2A to 2F are diagrams for explaining a method of manufacturing the organic luminescent device according to the first embodiment of the present invention.

The method of manufacturing the organic luminescent device according to the first embodiment of the present invention includes the steps of: forming the second principal surface of the substrate 1 into a rough surface, forming the anode 2 on the first principal surface of the substrate 1, and thereafter forming the reflection electrode 5 on the anode 2; forming the insulating layer 6 on the reflection electrode 5, and thereafter forming the organic luminescent layer 3 and the cathode 4 on the anode 2 sequentially; and forming the filler member 9 on the resultant substrate 1 including the cathode 4 thus formed, and thereafter sealing the consequent substrate 1 with the sealing plate 8.

Hereinbelow, detailed descriptions are provided for the manufacturing steps.

Figure 2A:
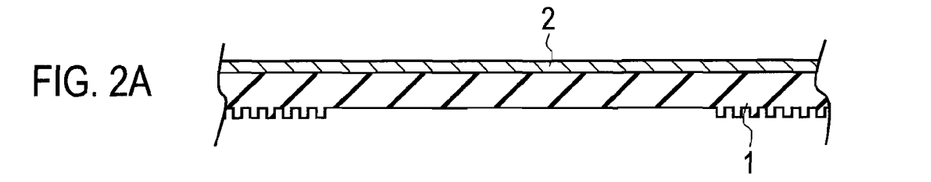
FIG. 2A is a process view showing a step of forming a second principal surface of a substrate 1 into a rough surface, and of forming an anode 2 on a first principal surface of the substrate 1.

(a) First of all, as shown in FIG. 2A, part of the second principal surface of the substrate 1 made of glass is formed into a rough surface by etching, blast processing or the like. In this respect, the part is opposed to the reflection electrode 5. Subsequently, the anode 2 made of ITO is formed on the first principal surface of the substrate 1 by sputtering or the like.

Figure 2B:
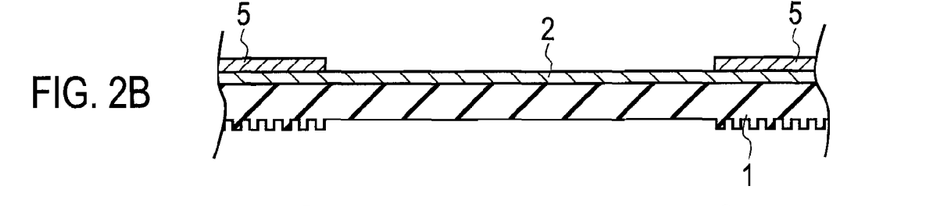
FIG. 2B is a process view showing a step of forming a reflection electrode 5.

(b) Thereafter, as shown in FIG. 2B, the reflection electrode 5 made of aluminum is formed on the anode 2 by patterning and etching.

Figure 2C:
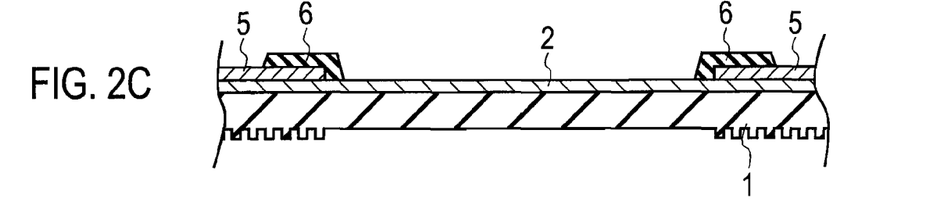
FIG. 2C is a process view showing a step of forming an insulating layer 6.

(c) Afterward, as shown in FIG. 2C, the insulating layer 6 made of $SiO_2$ is formed on the surface of an end portion of the reflection electrode 5 by CVD (Chemical Vapor Deposition) or the like.

Figure 2D:
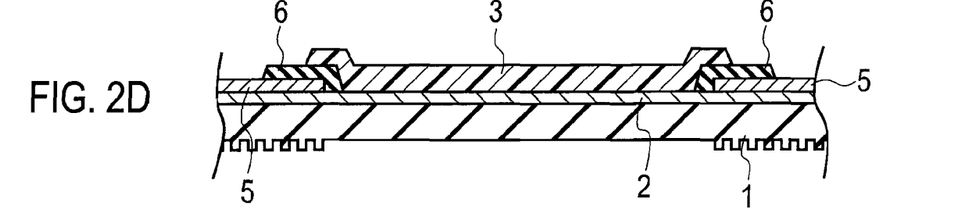
FIG. 2D is a process view showing a step of forming an organic luminescent layer 3.

(d) After that, as shown in FIG. 2D, the organic luminescent layer 3 is formed by sequentially depositing the hole transport layer, the luminescent part and the electron transport layer by vacuum evaporation or the like.

Figure 2E:
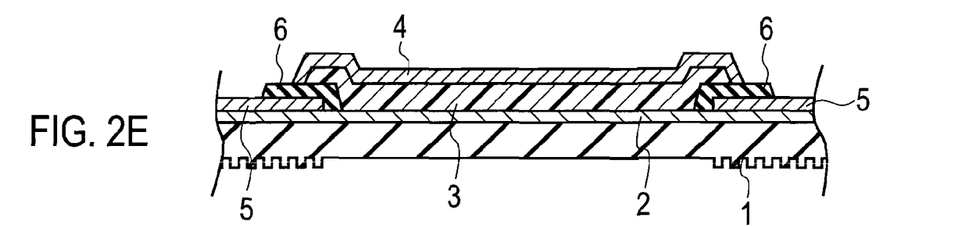
FIG. 2E is a process view showing a step of forming a cathode 4.

(e) Subsequently, as shown in FIG. 2E, the cathode 4 made of aluminum is formed on the organic luminescent layer 3 by sputtering or the like.

Figure 2F:
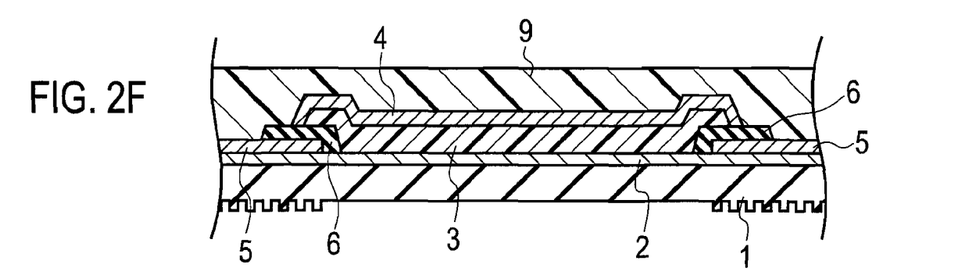
FIG. 2F is a process view showing a step of forming a filler member 9.

(f) Thereafter, as shown in FIG. 2F, the filler member 9 is formed on the resultant substrate 1 including the cathode 4 thus formed by coating the resultant substrate 1 with the filler member 9 made of an epoxy resin, for example.

(g) Finally, as shown in FIG. 1, the sealing plate 8 made of glass adheres to the consequent substrate 1 with the filler member 9 interposed therebetween, and thus sealing is achieved. In this way, the organic luminescent device 20 shown in FIG. 1 is completed.

In a conventional organic luminescent device provided with no reflection electrode 5, most of the light radiating from the luminescent area travels as a guided wave in the substrate 1 having a higher refractive index while undergoing total reflection in the substrate 1, and is absorbed by the seal resin 10, the filler member 9 and the like, thereby turning into heat.

Figure 8A:
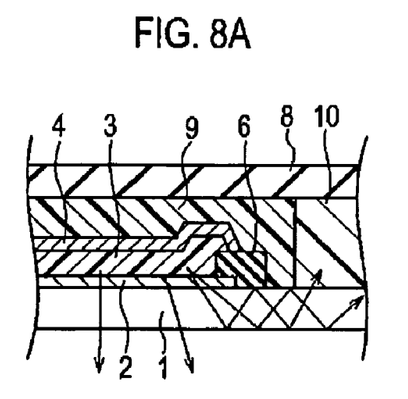
FIG. 8A is an explanatory view concerning a conventional organic luminescent device.
Figure 8B:
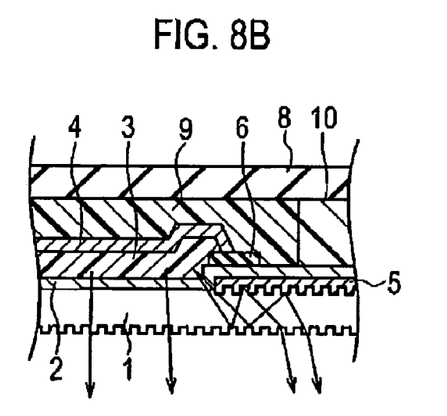
FIG. 8B is an explanatory view concerning the organic luminescent device according to the modification of the second embodiment of the present invention.

In the first embodiment of the present invention, the reflection electrode 5 is arranged contiguous to the end portion of the luminescent area. Additionally in the first embodiment, the part of the second principal surface of the substrate 1, which part is opposed to the reflection electrode 5, is formed into the rough surface. For this reason, as shown in FIG. 8B, in the first embodiment, most of the light radiating from the luminescent part is reflected by the reflection electrode 5, when the light reaches the reflection electrode 5 after repeating total reflection in the substrate 1. Additionally, in the first embodiment, the amount of light which does not undergo total reflection inside the roughed part of the second principal surface of the substrate 1, and which accordingly radiates from the substrate 1 increases, so that light extraction efficiency can be improved.

Furthermore, the reflection electrode 5 has an effect of reducing the resistance of the anode 2 made of the transparent electrode, so that the voltage load and the power consumption thereof can be decreased.

The organic luminescent device according to the first embodiment of the present invention is capable of improving light extraction efficiency.

Modification of the First Embodiment

Figure 3:
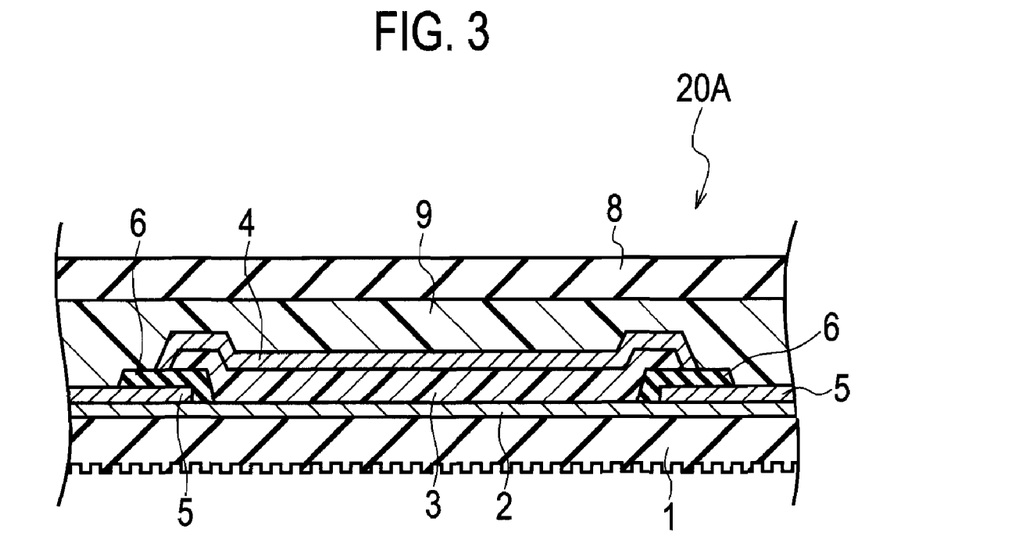
FIG. 3 is a schematic cross-sectional structural view of an organic luminescent device according to a modification of the first embodiment of the present invention.

In an organic luminescent device according to a modification of the first embodiment of the present invention, as shown in FIG. 3, the second principal surface of the substrate 1 is entirely formed into a rough surface. Since the rest of the configuration is almost the same as that in the first embodiment, the description thereof is omitted.

In a method of manufacturing an organic luminescent device according to the modification of the first embodiment of the present invention, an organic luminescent device 20A can be manufactured by forming the second principal surface of the substrate 1 entirely into a rough surface by etching, blast processing or the like.

In the modification of the first embodiment, light reflected by the reflection electrode 5 radiating from the substrate 1 and the amount of light which does not undergo total reflection in the substrate 1, and which radiates through the substrate 1 from inside the roughed rear surface of the substrate 1 increase, so that light extraction efficiency can be improved.

The organic luminescent device according to the modification of the first embodiment of the present invention is capable of improving light extraction efficiency.

Second Embodiment

Figure 4:
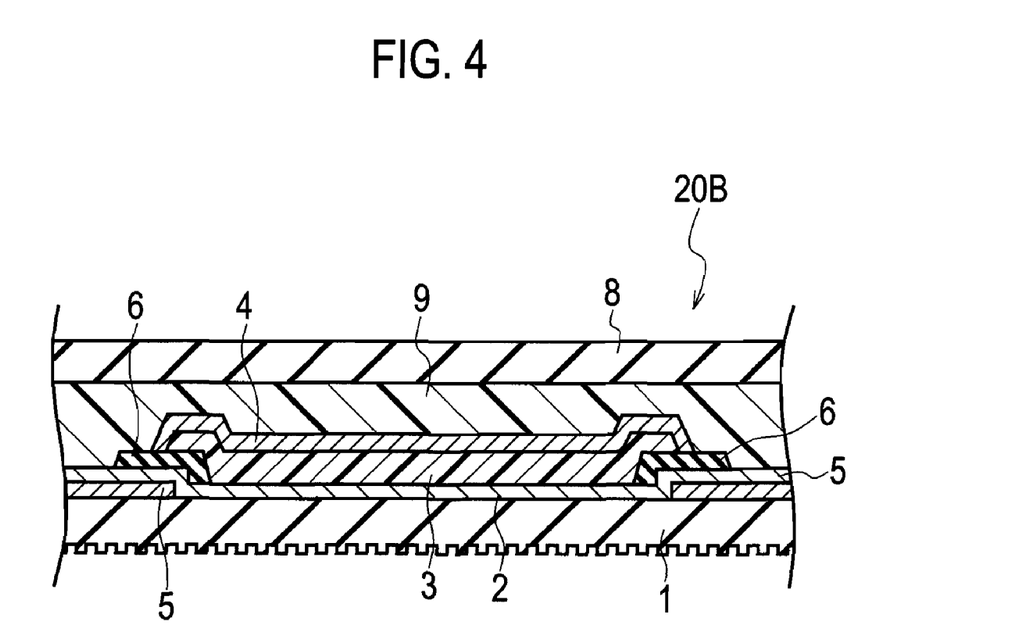
FIG. 4 is a schematic cross-sectional structural view of an organic luminescent device according to a second embodiment of the present invention.

Descriptions are provided for an organic luminescent device according to a second embodiment of the present invention by referring to FIG. 4. Note that in the second embodiment, the same parts as those in the first embodiment are denoted by the same reference numerals, and repetitive descriptions thereof are omitted.

As shown in FIG. 4, the organic luminescent device according to the second embodiment of the present invention includes: a substrate 1 including first and second principal surfaces which are opposed to each other; an organic luminescent layer 3 arranged on the first principal surface of the substrate 1, the organic luminescent layer 3 held between a pair of electrodes (2, 4), and at least one of the pair of electrodes (2, 4) being a transparent electrode; and a reflection electrode 5 arranged contiguous to a luminescent area of the organic luminescent layer 3, the reflection electrode 5 arranged on a front surface or a back surface of the transparent electrode 2. The transparent electrode 2 is arranged on the first principal surface of the substrate 1; the reflection electrode 5 is arranged between the transparent electrode 2 and the first principal surface of the substrate 1; and the second principal surface of the substrate 1 is entirely formed into a rough surface. Since the rest of the configuration is almost the same as that in the first embodiment, descriptions thereof are omitted.

As shown in FIG. 4, in the second embodiment, the anode 2 made of the transparent electrode is arranged on the first principal surface of the substrate 1; the reflection electrode 5 is arranged between the anode 2 and the first principal surface of the substrate 1; and the second principal of the substrate 1 is entirely formed into the rough surface.

As the rough surface, the second principal surface of the substrate 1 preferably has an arithmetic mean roughness Ra of 0.01 µm to 1 µm, and more preferably 0.1 µm to 1 µm.

A method of manufacturing an organic luminescent device according to the second embodiment is the same as that according to the first embodiment, except how the second principal surface of the substrate 1 is formed into a rough surface, and a way how the anode 2 and the reflection electrode 5 are formed.

In the method of manufacturing an organic luminescent device according to the second embodiment, first of all, the second principal surface of the substrate 1 is entirely formed into the rough surface by etching, blast processing or the like. Subsequently, the reflection electrode 5 is formed on the first principal surface of the substrate 1 by patterning or the like. Thereafter, the anode 2 is formed on the reflection electrode 5 and the substrate 1 by sputtering or the like. Thereby, the method of manufacturing an organic luminescent device according to the second embodiment is capable of manufacturing an organic luminescent device 20B.

The refractive index of, for example, ITO used for the transparent electrode as the anode 2 is as high as 2.0 to 2.2 in the visible light range. For this reason, part of light radiating from the luminescent area transmits as a guided wave in the anode 2 while repeating total reflection in the substrate 1, and is sooner or later absorbed by the seal resin 10, the filler member 9 and the like, as well as is thus turned into heat.

In the second embodiment of the present invention, the reflection electrode 5 is arranged between the anode 2 and the first principal surface of the substrate 1. For this reason, the second embodiment causes light radiating from the luminescent part is reflected by the reflection electrode 5, when the light reaches the reflection electrode 5 after repeating total reflection in the substrate 1. Additionally, in the second embodiment, the amount of light which does not undergo total reflection inside the roughed second principal surface of the substrate 1, and which radiates from the substrate 1 increases, so that light extraction efficiency can be improved.

The organic luminescent device according to the second embodiment of the present invention is capable of improving light extraction efficiency.

Modification Of The Second Embodiment

Figure 5:
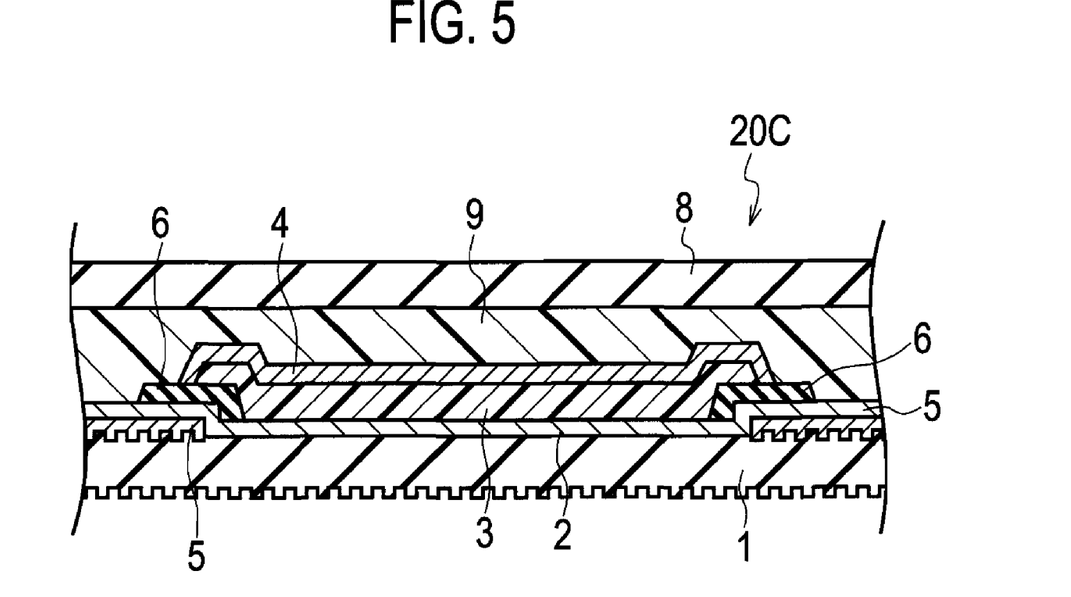
FIG. 5 is a schematic cross-sectional structural view of an organic luminescent device according to a modification of the second embodiment of the present invention.

In an organic luminescent device according to a modification of the second embodiment of the present invention, as shown in FIG. 5, part of the first principal surface of the substrate 1 is formed into a rough surface. In this respect, the part is in contact with the reflection electrode 5. Since the rest of the configuration is almost the same as that in the second embodiment, descriptions thereof are omitted.

The rough surface in the first principal surface of the substrate 1 preferably has an arithmetic mean roughness Ra of 0.01 µm to 1 µm, and more preferably 0.1 µm to 1 µm.

In a method of manufacturing an organic luminescent device according to the modification of the second embodiment, the second principal surface of the substrate 1 is entirely formed into a rough surface by etching, blast processing or the like. Thereafter, the first principal surface of the substrate 1 is formed into a rough surface on its part opposed to the reflection electrode 5. Thereby, the method of manufacturing an organic luminescent device according to the modification of the second embodiment is capable of manufacturing an organic luminescent device 20C.

In the modification of the second embodiment, the first principal surface of the substrate 1 is formed into the rough surface on its part opposed to the reflection electrode 5. For this reason, in the modification, most of the light repeating total reflection in the substrate 1 can be incident on the reflection electrode 5, and thus increases the amount of light radiating from the substrate 1 after reflected off the reflection electrode 5. Thus, light extraction efficiency is improved.

The organic luminescent device according to the modification of the second embodiment of the present invention is capable of improving light extraction efficiency.

Third Embodiment

Figure 6:
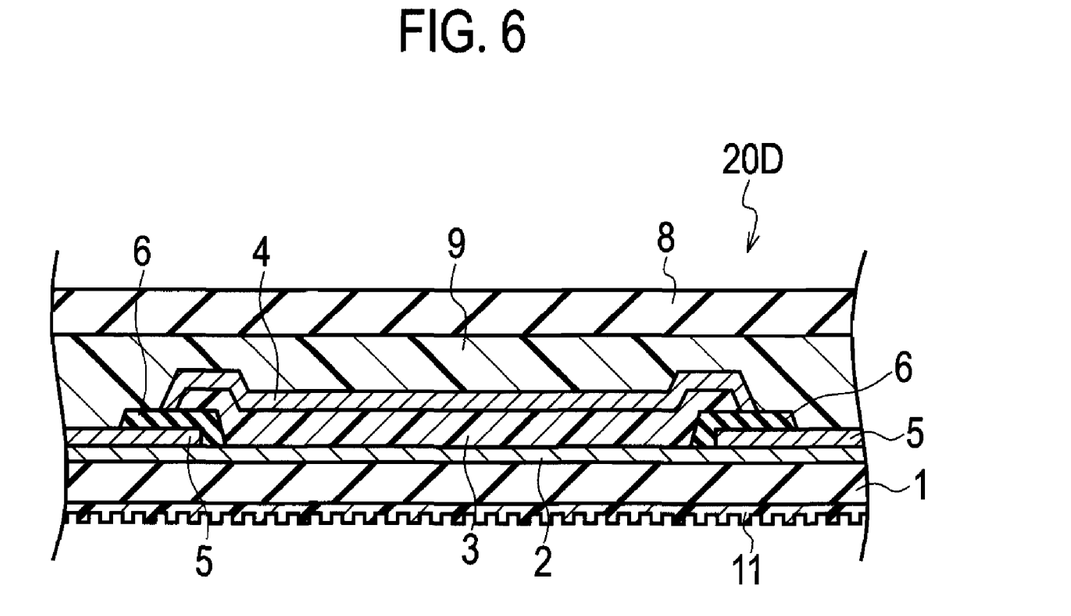
FIG. 6 is a schematic cross-sectional structural view of an organic luminescent device according to a third embodiment of the present invention.

Descriptions are provided for an organic luminescent device according to a third embodiment of the present invention by referring to FIG. 6. Note that in the third embodiment, the same parts as those in the first embodiment are denoted by the same reference numerals, and repetitive descriptions thereof are omitted.

In the organic luminescent device according to the third embodiment of the present invention, as shown in FIG. 6, the transparent electrode 2 is arranged on the first principal surface of the substrate 1; the reflection electrode 5 is arranged on the transparent electrode 2; a film 11 is arranged on the second principal surface of the substrate 1, the surface of the film being roughed at least on its part opposed to the reflection electrode 5. Since the rest of the configuration is almost as the same as that in the first embodiment, descriptions thereof are omitted.

As shown in FIG. 6, the third embodiment causes the film 11 to be arranged on the second principal surface of the substrate 1. In this respect, one surface of the film is roughed.

No specific restriction is imposed on the film 11, except that the film 11 is capable of transmitting light and the refractive index of the film 11 is almost equal to, or smaller than, that of the substrate 1. Glass, an epoxy resin, an acrylic resin and the like can be cited as desirable examples of the material for the film 11.

The film 11 is preferably 0.2 µm to 10 µm in thickness, for instance. The rough surface of the film 11 preferably has an arithmetic mean roughness Ra of 0.01 µm to 1 µm, and more preferably 0.1 µm to 1 µm.

A method of manufacturing an organic luminescent device according to the third embodiment is different from the method of manufacturing an organic luminescent device according to the first embodiment in that the method according to the third embodiment includes a step of forming the film 11. Since the rest of the manufacturing method is the same as that in the first embodiment, repetitive descriptions thereof are omitted.

In the method of manufacturing an organic luminescent device according to the third embodiment, one surface of the film 11 is formed into a rough surface by etching, blast processing or the like; and the other surface of the film 11 adheres to the second principal surface of the substrate 1 with an adhering resin or the like. Thereby, the manufacturing method according to the third embodiment is capable of manufacturing an organic luminescent device 20D.

In the third embodiment of the present invention, the film 11 prepared in advance can be arranged on the second principal surface of the substrate 1, and thus the manufacturing method can be simplified.

The organic luminescent device according to the third embodiment of the present invention is capable of improving light extraction efficiency.

Fourth Embodiment

Figure 7:
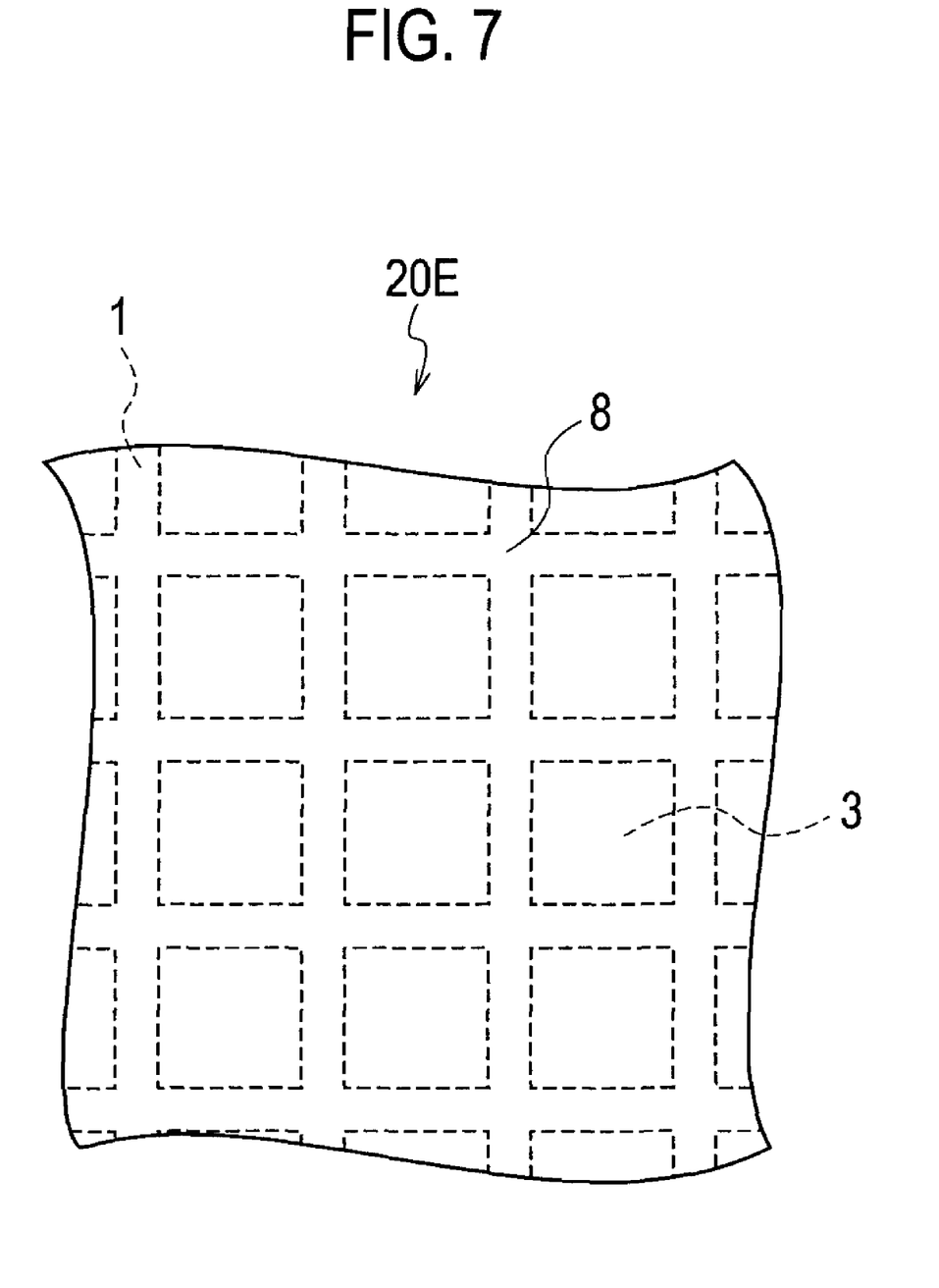
FIG. 7 is a schematic plan view of an organic luminescent device according to a fourth embodiment of the present invention.

Descriptions are provided for an organic luminescent device according to a fourth embodiment of the present invention by referring to FIG. 7. Note that in the fourth embodiment, the same parts as those in the first embodiment are denoted by the same reference numerals, and repetitive descriptions thereof are omitted.

As shown in FIG. 7, the organic luminescent device according to the fourth embodiment of the present invention includes multiple organic luminescent devices 20 arranged contiguous to one another. Each of the multiple organic luminescent devices 20 includes: a substrate 1 including first and second principal surfaces which are opposed to each other; an organic luminescent layer 3 arranged on the first principal surface of the substrate 1, the organic luminescent layer 3 held between a pair of electrodes (2, 4), and at least one of the pair of electrodes (2, 4) being a transparent electrode; and a reflection electrode 5 arranged contiguous to a luminescent area of the organic luminescent layer 3, the reflection electrode 5 arranged on a front surface or a back surface of the transparent electrode 2. In each organic luminescent device 20, the transparent electrode 2 is arranged on the first principal surface of the substrate 1; the reflection electrode 5 is arranged on the transparent electrode 2; and the second principal surface of the substrate 1 is formed into a rough surface at least on its part opposed to the reflection electrode 5. Since the rest of the configuration in the fourth embodiment is almost the same as that in the first embodiment, descriptions thereof are omitted.

As shown in FIG. 7, the fourth embodiment expands the substrate 1 in the horizontal directions, and arranges the multiple organic luminescent layers 3 above the substrate 1 to be contiguous to one another, as well as consequently builds a unit structure which includes organic luminescent surface light sources collectively.

A method of manufacturing an organic luminescent device according to the fourth embodiment is different from the method of manufacturing an organic luminescent device according to the first embodiment in that the multiple organic luminescent layers 3 are formed above the substrate 1. Since the rest of the method of manufacturing an organic luminescent device according to the fourth embodiment is the same as that in the first embodiment, descriptions thereof are omitted.

In the fourth embodiment of the present invention, each reflection electrode 5 is arranged contiguous to the end portion of the corresponding luminescent area. For this reason, when light radiating from each luminescent part reaches the corresponding reflection electrode 5 after repeating total reflection in the corresponding part of the substrate 1, most of the light is reflected by the reflection electrode 5, and radiates from the substrate 1 efficiently. In other words, light is efficiently extracted from the outsides of the luminescent areas which constitute connection areas among the organic luminescent layers 3 contiguous to one another, respectively.

This makes it possible to achieve the optically seamless (with no gaps) organic luminescent device 20E without using light diffusion plate or the like to cover the connection areas among the organic luminescent layers 3.

The organic luminescent device according to the fourth embodiment of the present invention is capable of improving light extraction efficiency.

Other Embodiments

As described above, the present invention has been described in detail with the first to fourth embodiments. To those skilled in the art, it is clear that the present invention is not limited to the first to fourth embodiments which have been explained in the present description. The present invention can be carried out as corrected or modified embodiments without departing from the principle or scope of the present invention defined by the description in the scope of claims. For this reason, the descriptions intend to explain the present invention by citing the examples of the present invention, and impose no restriction on the present invention. Hereinbelow, descriptions are provided for modifications obtained by modifying part of the first to fourth embodiments.

For instance, dimensions including the thicknesses of the respective layers and materials thereof can be modified.

The organic luminescent device according to the first embodiment has been described as including: the reflection electrode 5 arranged contiguous to the end portion of the luminescent area, the reflection electrode 5 arranged on the front surface of the anode 2; and the anode 2 arranged on the first principal surface of the substrate 1. However, the first principal surface of the substrate 1 may be formed into a rough surface on its part opposed to the reflection electrode 5. With this configuration, more of the light repeating total reflection in the substrate 1 after radiating from the luminescent area can be incident on the reflection electrode 5. This increases the amount of light which radiates from the substrate 1 after reflected by the reflection electrode 5, so that light extraction efficiency can be further improved.

Moreover, the organic luminescent device according to each of the first to third embodiments has been described as defining the rough surface by use of the arithmetic mean roughness Ra. Instead, the rough surface may be shaped like convexes such as almost rectangular, conic or polygonal columns, or a combination thereof. With this configuration, the same effect as that in the first embodiment can be obtained.

What is claimed is:

1. An organic luminescent device comprising:
    a substrate having first and second principal surfaces which are opposed to each other;
    an organic luminescent layer arranged on the first principal surface of the substrate and held between a pair of electrodes, at least one of the pair of electrodes being a transparent electrode;
    a reflection electrode adjacent to a luminescent area of the organic luminescent layer, the reflection electrode being arranged on any one of a front surface and a back surface of the transparent electrode,
    wherein
    the transparent electrode is arranged on the first principal surface of the substrate,
    the reflection electrode is arranged between the transparent electrode and the first principal surface,
    the second principal surface of the substrate is formed into a rough surface at least on its part opposed to the reflection electrode, and
    the first principal surface of the substrate and a surface of the reflection electrode that is in contact with the first principal surface are each formed into a rough surface.

2. The organic luminescent device of claim 1, wherein the second principle surface of the substrate is provided with a film whose surface is formed into a rough surface.

3. An organic luminescent device, wherein a plurality of organic luminescent devices of claim 2 are arranged contiguous to each other.

4. An organic luminescent device, wherein a plurality of organic luminescent devices of claim 1 are arranged contiguous to each other.

* * * * *